(12) United States Patent
Urban

(10) Patent No.: US 11,494,249 B2
(45) Date of Patent: Nov. 8, 2022

(54) DATA INTERPRETATION WITH MODULATION ERROR RATIO ANALYSIS

(71) Applicant: Comcast Cable Communications, LLC, Philadelphia, PA (US)

(72) Inventor: David Urban, Downingtown, PA (US)

(73) Assignee: COMCAST CABLE COMMUNICATIONS, LLC, Philadelphia, PA (US)

(*) Notice: Subject to any disclaimer, the term of this patent is extended or adjusted under 35 U.S.C. 154(b) by 0 days.

(21) Appl. No.: 17/319,903

(22) Filed: May 13, 2021

(65) Prior Publication Data

US 2022/0114039 A1 Apr. 14, 2022

Related U.S. Application Data

(63) Continuation of application No. 16/784,075, filed on Feb. 6, 2020, now Pat. No. 11,042,433, which is a continuation of application No. 14/259,604, filed on Apr. 23, 2014, now Pat. No. 10,606,676.

(51) Int. Cl.
| | |
|---|---|
| *G06F 11/07* | (2006.01) |
| *H04L 1/00* | (2006.01) |
| *H03M 13/37* | (2006.01) |
| *H03M 13/01* | (2006.01) |
| *H04L 1/20* | (2006.01) |
| *H03M 13/11* | (2006.01) |

(52) U.S. Cl.
CPC ........ *G06F 11/076* (2013.01); *H03M 13/015* (2013.01); *H03M 13/3738* (2013.01); *H04L 1/0045* (2013.01); *H04L 1/206* (2013.01); *H03M 13/1105* (2013.01)

(58) Field of Classification Search
CPC ............... G06F 11/076; H03M 13/015; H03M 13/3738; H03M 13/1105; H04L 1/0045; H04L 1/206
See application file for complete search history.

(56) References Cited

U.S. PATENT DOCUMENTS

| | | | |
|---|---|---|---|
| 7,940,642 B2 | 5/2011 | Chun et al. | |
| 8,320,473 B1 * | 11/2012 | Conway | H03M 7/3082 |
| | | | 375/259 |
| 8,559,498 B1 | 10/2013 | Eliaz | |
| 2004/0219883 A1 | 11/2004 | Pauli et al. | |
| 2007/0140361 A1 | 6/2007 | Beales | |
| 2008/0075156 A1 | 3/2008 | Schumacher et al. | |
| 2009/0122903 A1 | 5/2009 | Miyazaki et al. | |
| 2009/0150746 A1 | 6/2009 | Chaichanavong et al. | |

(Continued)

OTHER PUBLICATIONS

Bertocco, M., et al., "Cross-Layer Measurement for the Analysis of DVB-T System Performance", IEEE Transactions on Instrumentation and Measurement, 2008, vol. 57, No. 7, pp. 1304-1312.

(Continued)

*Primary Examiner* — Kyle Vallecillo
(74) *Attorney, Agent, or Firm* — Ballard Spahr LLP

(57) ABSTRACT

Methods and systems for analyzing data are disclosed. An example method can comprise receiving a first data signal, decoding the first data signal, determining a second data signal based on the decoded first data signal, and determining a modulation error ratio based on a difference between the first data signal and the second data signal.

20 Claims, 6 Drawing Sheets

(56) References Cited

U.S. PATENT DOCUMENTS

| | | |
|---|---|---|
| 2009/0300461 A1 | 12/2009 | Shor et al. |
| 2010/0020896 A1 | 1/2010 | Willems et al. |
| 2010/0125764 A1 | 5/2010 | Kose |
| 2010/0329376 A1 | 12/2010 | Wang et al. |
| 2011/0007828 A1 | 1/2011 | Wang et al. |
| 2011/0255642 A1 | 10/2011 | Nagai et al. |
| 2011/0268169 A1* | 11/2011 | Mitsugi ............... H04L 25/0212 375/232 |
| 2012/0189070 A1 | 7/2012 | Kroeger |
| 2012/0266040 A1 | 10/2012 | Hamkins |
| 2013/0004179 A1 | 1/2013 | Nielsen et al. |
| 2013/0044800 A1 | 2/2013 | Ogawa et al. |
| 2013/0265444 A1 | 10/2013 | Walsh et al. |
| 2014/0282783 A1 | 9/2014 | Totten et al. |
| 2014/0321575 A1 | 10/2014 | Asakura et al. |
| 2015/0110227 A1 | 4/2015 | Jin et al. |
| 2015/0229380 A1 | 8/2015 | Bartelt et al. |
| 2015/0236818 A1 | 8/2015 | Qi et al. |
| 2015/0270856 A1 | 9/2015 | Breynaert et al. |
| 2015/0288553 A1 | 10/2015 | Qi et al. |

OTHER PUBLICATIONS

Signal-to-noise ratio, https://en.wikipedia.org/w/index.php?title=Signal-to-noise_ratio&oldid=735978767 (last visited Aug. 26, 2016), pp. 1-9.

Likelihood-ratio test, https://en.wikipedia.org/w/index.php?title=Likelihood-ratio_test&oldid=730570334 (last visited Aug. 26, 2016), pp. 1-7.

Forward error correction, https://en.wikipedia.org/w/index.php?title=Forward_error_correction&oldid=722922772 (last visited Jun. 30, 2016).

* cited by examiner

US 11,494,249 B2

DATA INTERPRETATION WITH MODULATION ERROR RATIO ANALYSIS

CROSS REFERENCE TO RELATED APPLICATIONS

This application is a Continuation of U.S. application Ser. No. 16/784,075, filed on Feb. 6, 2020, which is a continuation of U.S. application Ser. No. 14/259,604, filed on Apr. 23, 2014, each of which are herein incorporated by reference in their entireties.

BACKGROUND

Data signals provided over a physical network are subject to a variety of transmission problems. These transmission problems can distort the original data signal when the data signal is received at a receiving device. These distortions result in the loss of data. Thus, there is a need for more sophisticated methods and systems for interpreting data signals on a network link to minimize data loss.

SUMMARY

It is to be understood that both the following general description and the following detailed description are exemplary and explanatory only and are not restrictive, as claimed. Methods and systems for analyzing data are disclosed. An example method can comprise receiving a first data signal, decoding the first data signal, determining a second data signal based on the decoded first data signal, and determining a modulation error ratio based on a difference between the first data signal and the second data signal.

In an aspect, an example method can comprise receiving a first data vector, determining a codeword based on the first data vector, determining a second data vector based on the codeword, and determining a modulation error ratio based on a difference between the first data vector and the second data vector. The first data signal can be and/or comprise a distorted signal of an original data signal transmitted by the second device.

In another aspect, an example method can comprise receiving a plurality of data vectors, determining a codeword based on at least a portion of the plurality of received data vectors, determining a transmitted data vector based on the codeword. A received data vector of the plurality of received data vector can be identified to correspond to the transmitted data vector, and an error ratio can be determined based on a difference between the transmitted data vector and the corresponding received data vector of the plurality of received data vectors.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
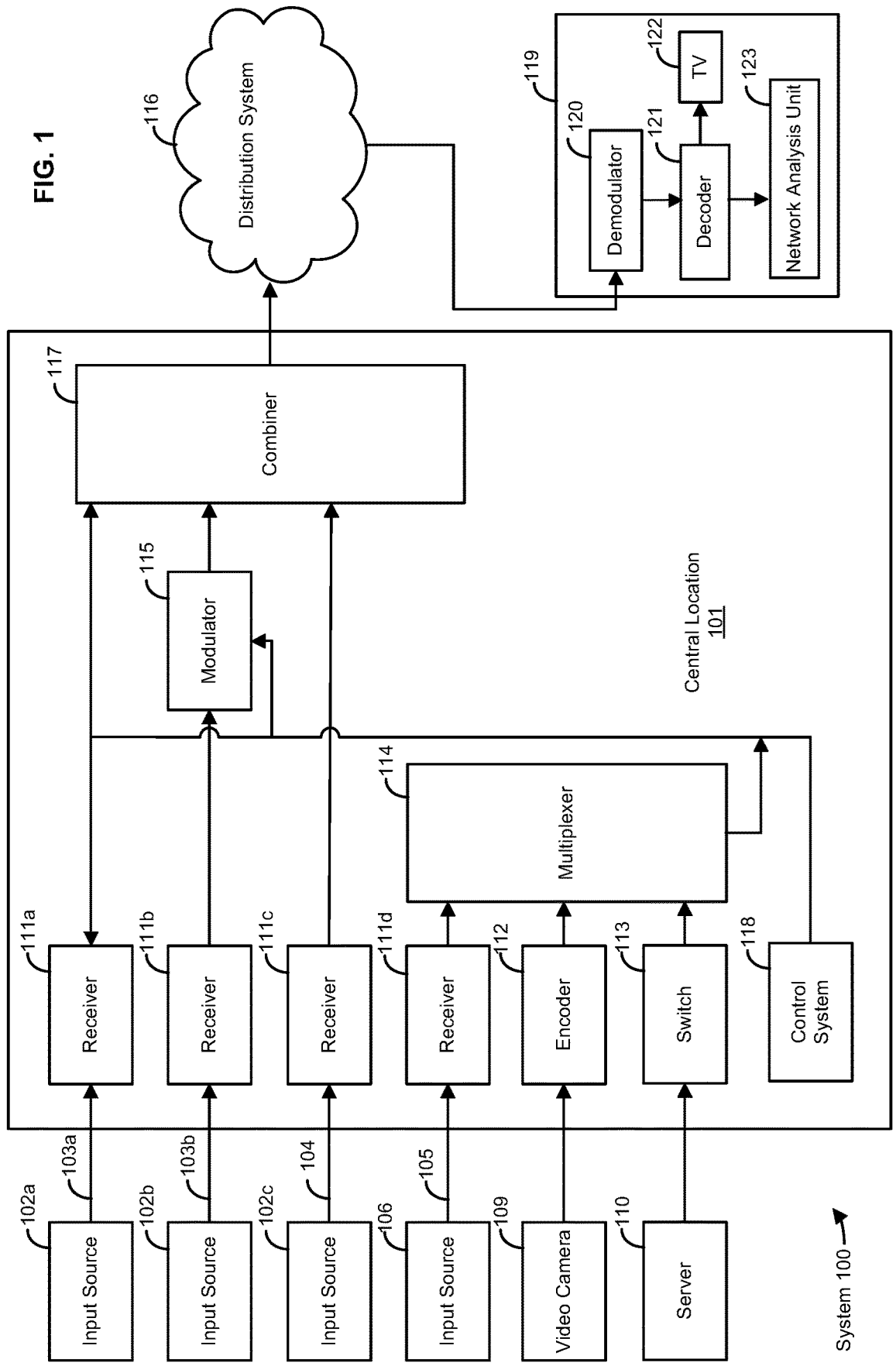
FIG. 1 is a block diagram illustrating an example system.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

In one aspect, the present methods and systems are related to error analysis of data transmitted across a network. More specifically, the present methods and systems are related to modulation, demodulation, encoding, decoding, and other aspects related to transmitting data in the presence of a noise signal, distortion, or other interference on a network. For example, data can be provided across a network as a data signal to a device. The device can be configured to interpret a value that the data signal represents based on soft-decoding techniques, such as low density parity check based decoding. In one aspect, the device can comprise a demodulator configured to determine a log-likelihood ratio that a portion of a distorted signal is intended to represent a particular data value.

FIG. 1 illustrates various aspects of an exemplary system in which the present methods and systems can operate. Those skilled in the art will appreciate that present methods may be used in systems that employ both digital and analog equipment. One skilled in the art will appreciate that provided herein is a functional description and that the respective functions can be performed by software, hardware, or a combination of software and hardware.

The system 100 can comprise a central location 101 (e.g., a headend), which can receive content (e.g., data, input programming, and the like) from multiple sources. The central location 101 can combine the content from the various sources and can distribute the content to user (e.g., subscriber) locations (e.g., location 119) via a distribution system 116.

In an aspect, the central location 101 can receive content from a variety of sources 102a, 102b, 102c. The content can be transmitted from the source to the central location 101 via a variety of transmission paths, including wireless (e.g., satellite paths 103a, 103b) and terrestrial path 104. The central location 101 can also receive content from an input source 106 via a direct line 105. Other input sources can comprise capture devices such as a video camera 109 or a server 110. The signals provided by the content sources can include a single content item or a multiplex that includes several content items.

The central location 101 can comprise one or a plurality of receivers 111a, 111b, 111c, 111d that are each associated with an input source. For example, MPEG encoders such as encoder 112, are included for encoding local content or a video camera 109 feed. A switch 113 can provide access to server 110, which can be a Pay-Per-View server, a data server, an internet router, a network system, a phone system, and the like. Some signals may require additional processing, such as signal multiplexing, prior to being modulated. Such multiplexing can be performed by multiplexer (mux) 114.

The central location 101 can comprise one or a plurality of modulators 115 for interfacing to the distribution system 116. The modulators can convert the received content into a modulated output signal suitable for transmission over the distribution system 116. The output signals from the modulators can be combined, using equipment such as a combiner 117, for input into the distribution system 116.

A control system 118 can permit a system operator to control and monitor the functions and performance of the system 100. The control system 118 can interface, monitor, and/or control a variety of functions, including, but not limited to, the channel lineup for the television system, billing for each user, conditional access for content distributed to users, and the like. The control system 118 can provide input to the modulators for setting operating parameters, such as system specific MPEG table packet organization or conditional access information. The control system 118 can be located at the central location 101 or at a remote location.

The distribution system 116 can distribute signals from the central location 101 to user locations, such as a user location 119. The distribution system 116 can be an optical fiber network, a coaxial cable network, a hybrid fiber-coaxial network, a wireless network, a satellite system, a direct broadcast system, or any combination thereof. There can be a multitude of user locations connected to the distribution system 116. At the user location 119, a demodulator 120, a decoder 121 and/or the like in a device, such as a gateway, home communications terminal (HCT), or set top box, can process (e.g., demodulate, decode), if needed, the signals for display on a display device, such as on a television set (TV) 122 or a computer monitor. Those skilled in the art will appreciate that the signal can be decoded in a variety of equipment, including the HCT, a computer, a TV, a monitor, or a satellite dish. In an exemplary aspect, the methods and systems disclosed can be located within, or performed on, one or more decoder 121, TVs 122, central locations 101, DVRs, home theater PCs, and the like.

In an aspect, user location 119 is not fixed. By way of example, a user can receive content from the distribution system 116 on a mobile device such as a laptop computer, PDA, smartphone, GPS, vehicle entertainment system, portable media player, and the like.

In an exemplary embodiment, the methods and systems disclosed can be located within equipment located at user location 119. For example, the methods and systems can be implemented on the demodulator 120, the decoder 121, and/or a network analysis unit 123. For example, data can be provided across a network (e.g., the distribution system 116) as a data signal to the user location 119. In one aspect, a demodulator 120 in the user location 119 can be configured to determine a probability value (e.g., log-likelihood ratio) that a portion of a received data signal is intended to represent a particular data value in the demodulator 120. For example, probability values can be provided to the decoder 121 to interpret a bit value that the data signal represents based on soft-decoding techniques, such as low density parity check based decoding. The network analysis unit 123 can map one or more bit values to one or more data vectors. The network analysis unit 123 can determine the originally transmitted data signal based on one or more data vectors. The network analysis unit 123 can also determine a modulation error ratio (MER) based on a difference between the received data signal and the calculated received data signal.

Figure 2:
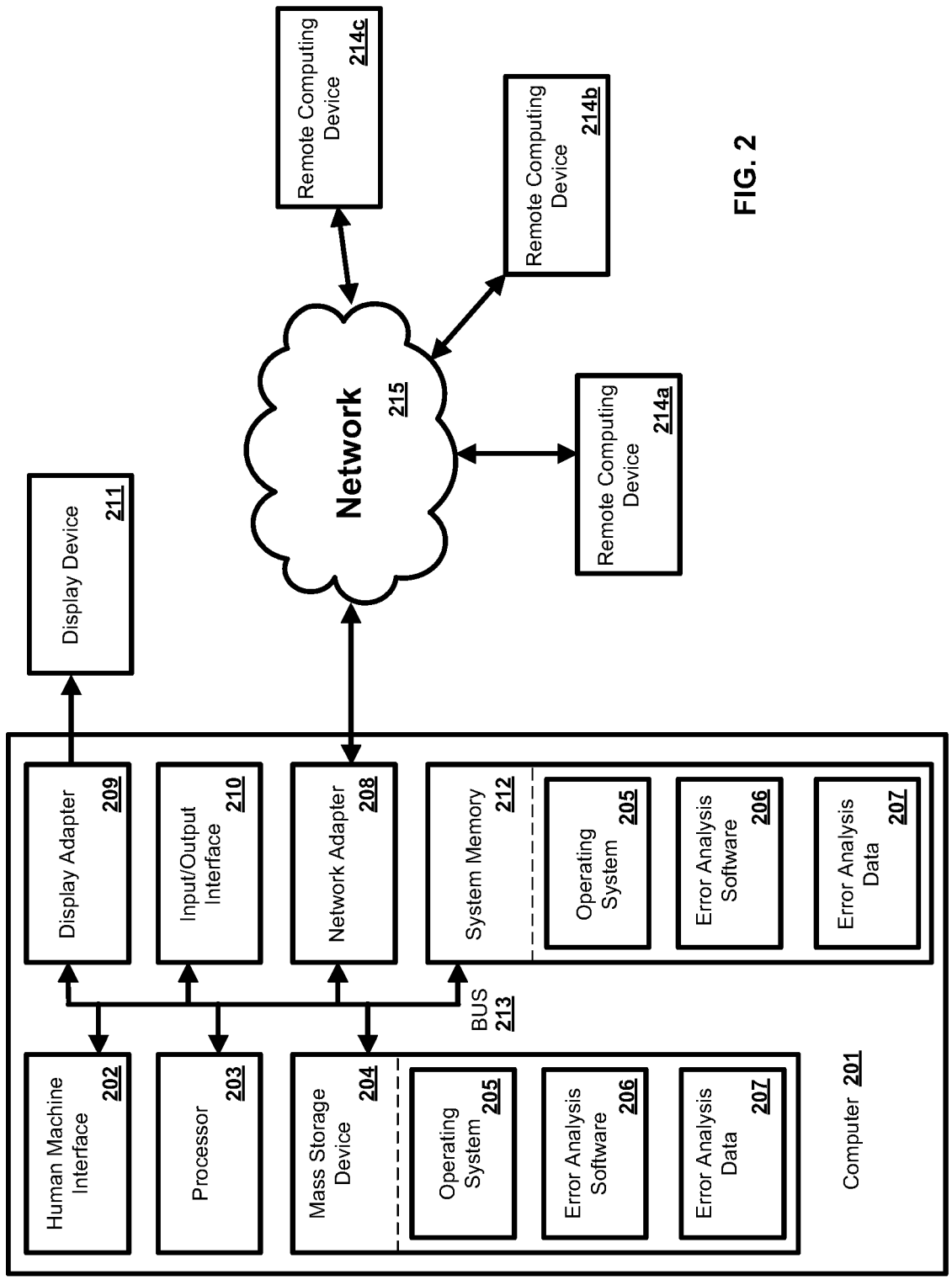
FIG. 2 is a block diagram illustrating an example computing system in which the present methods and systems can operate.

In an exemplary aspect, the methods and systems can be implemented on a computer 201 as illustrated in FIG. 2 and described below. By way of example, server 110 of FIG. 1, the first device 302 of FIG. 3, and/or the second device 312 of FIG. 3 can be a computer as illustrated in FIG. 2. Similarly, the methods and systems disclosed can utilize one or more computers to perform one or more functions in one or more locations. FIG. 2 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 201. The components of the computer 201 can comprise, but are not limited to, one or more processors 203, a system memory 212, and a system bus 213 that couples various system components including the one or more processors 203 to the system memory 212. In the case of multiple processors 203, the system can utilize parallel computing.

The system bus 213 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 213, and all buses specified in this description can also be implemented over a wired or wireless network connection and each of the subsystems, including the one or more processors 203, a mass storage device 204, an operating system 205, error analysis software 206, error analysis data 207, a network adapter 208, system memory 212, an Input/Output Interface 210, a display adapter 209, a display device 211, and a human machine interface 202, can be contained within one or more remote computing devices 214a,b,c at physically separate locations, connected through buses of this form, in effect implementing a fully distributed system.

The computer 201 typically comprises a variety of computer readable media. Exemplary readable media can be any available media that is accessible by the computer 201 and comprises, for example and not meant to be limiting, both volatile and non-volatile media, removable and non-removable media. The system memory 212 comprises computer readable media in the form of volatile memory, such as random access memory (RAM), and/or non-volatile memory, such as read only memory (ROM). The system memory 212 typically contains data such as error analysis data 207 and/or program modules such as operating system 205 and error analysis software 206 that are immediately accessible to and/or are presently operated on by the one or more processors 203.

In another aspect, the computer 201 can also comprise other removable/non-removable, volatile/non-volatile computer storage media. By way of example, FIG. 2 illustrates a mass storage device 204 which can provide non-volatile storage of computer code, computer readable instructions, data structures, program modules, and other data for the computer 201. For example and not meant to be limiting, the mass storage device 204 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 204, including by way of example, the operating system 205 and the error analysis software 206. Each of the operating system 205 and the error analysis software 206 (or some combination thereof) can comprise elements of the programming and the error analysis software 206. The error analysis data 207 can also be stored on the mass storage device 204. The error analysis data 207 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 201 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the one or more processors 203 via a human machine interface 202 that is coupled to the system bus 213, but can be connected by other interface and bus structures, such as a parallel port, game port, an IEEE 1394 Port (also known as a Firewire port), a serial port, or a universal serial bus (USB).

In yet another aspect, a display device 211 can also be connected to the system bus 213 via an interface, such as a display adapter 209. It is contemplated that the computer 201 can have more than one display adapter 209 and the computer 201 can have more than one display device 211. For example, a display device can be a monitor, an LCD (Liquid Crystal Display), or a projector. In addition to the display device 211, other output peripheral devices can comprise components such as speakers (not shown) and a printer (not shown) which can be connected to the computer 201 via the Input/Output Interface 210. Any step and/or result of the methods can be output in any form to an output device. Such output can be any form of visual representation, including, but not limited to, textual, graphical, animation, audio, tactile, and the like. The display 211 and the computer 201 can be part of one device, or separate devices.

The computer 201 can operate in a networked environment using logical connections to one or more remote computing devices 214a,b,c. By way of example, a remote computing device can be a personal computer, portable computer, smartphone, a server, a router, a network computer, a peer device or other common network node, and so on. Logical connections between the computer 201 and a remote computing device 214a,b,c can be made via a network 215, such as a local area network (LAN) and/or a general wide area network (WAN). Such network connections can be through the network adapter 208. The network adapter 208 can be implemented in both wired and wireless environments. Such networking environments are conventional and commonplace in dwellings, offices, enterprise-wide computer networks, intranets, and the Internet.

For purposes of illustration, application programs and other executable program components such as the operating system 205 are illustrated herein as discrete blocks, although it is recognized that such programs and components reside at various times in different storage components of the computing device 201, and are executed by the one or more processors 203. An implementation of the error analysis software 206 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g., genetic algorithms), swarm intelligence (e.g., ant algorithms), and hybrid intelligent systems (e.g., expert inference rules generated through a neural network or production rules from statistical learning).

Figure 3:
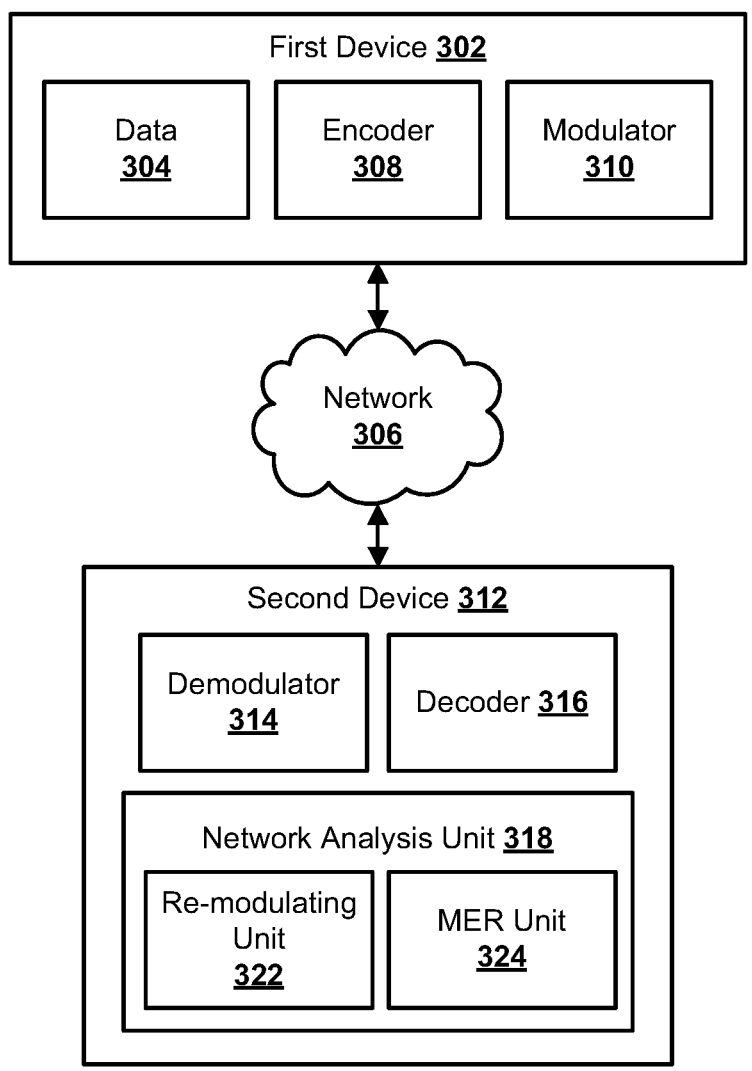
FIG. 3 is a block diagram illustrating an example system.

FIG. 3 is a block diagram illustrating an example system 300 for analyzing data content. In one aspect, the system 300 can comprise a first device 302. The first device 302 can comprise data 304. For example, data 304 can comprise video, audio, text, metadata, and other content. The data 304 can be organized as one or more data streams, such as content channels, video on demand, digital video recordings, and the like. In one aspect, the first device 302 can be configured to provide the data 304 to other devices through a network 306. For example, the first device 302 can be configured as a data server. In one aspect, the first device 302 can comprise a modulator 310 configured to modulate the data 304.

In one aspect, the network 306 can comprise a packet switched network (e.g., internet protocol based network), a non-packet switched network (e.g., quadrature amplitude modulation based network), and/or the like. The network 306 can comprise network adapters, switches, routers, modems, and the like connected through wireless links (e.g., radio frequency, satellite) and/or physical links (e.g., fiber optic cable, coaxial cable, Ethernet cable, or a combination thereof). In one aspect, the network 306 can be configured to provide communication from telephone, cellular, modem, and/or other electronic devices to and throughout the system 300.

In one aspect, the first device 302 can comprise a variety of devices configured to process the data 304. For example, the first device 302 can be a converged cable access platform (CCAP) configured to provide the data 304 across a variety of networks in a variety of formats. In one aspect, the first device 302 can comprise an encoder 308 configured to encode the data 304. For example, the encoder 308 can compress, encrypt, convert, or otherwise modify the data 304. As an example, the encoder 308 can compress the data 304 to an MPEG based format.

In one aspect, the encoder 308 can be configured to employ one or more error correction techniques. For example, the encoder 308 can be configured to segment the data 304 into a plurality of codewords. For example, the encoder 308 can encode a portion of the data 304 as a codeword. The codeword can comprise a plurality of data bits. The encoder 308 can be configured to generate one or more error check bits (e.g., parity check bits) based on the data bits. As an example, the one or more error check bits can be generated by multiplying the data bits by a codeword generation matrix. Thus, data bits of the codeword can be mathematically related to the one or more error check bits. For example, the one or more error check bits can determine linear combinations of data bits that equal a specified number (e.g., zero). As a further example, the error checking bits can specify a plurality of equations configured to evaluate to a certain value when the data bits remain intact (e.g., through transmission on the network 306). In one aspect, the encoder 308 can be configured as a low-density parity check encoder, or other encoder configured to encode error check bits for a soft-decision decoder.

In one aspect, the first device 302 can comprise a modulator 310 configured to modulate the data 304 for transmission across the network 306. For example, the modulator 310 can be configured to use analog and/or digital modulation, such as amplitude modulation (e.g., quadrature amplitude modulation), phase-shift keying (e.g., quadrature phase-shift keying), and the like. The modulator 310 can be configured to convert the data 304 to one or more data signals (e.g., radio frequency data signals) for transmission across the network 306. In one aspect, the modulator 310 can be configured to provide the data 304 based on one or more multiplexing techniques, such as orthogonal frequency division multiplexing (OFDM). For example, the modulator 310 can be configured to modulate the data 304 as a plurality of data symbols at a symbol rate. A data symbol can be a subcarrier state having a specific phase, magnitude, and frequency. A symbol rate can be a rate that a carrier changes state from one symbol to a next symbol. A data symbol can comprise a waveform that persists for a given period of time. The symbol rate can define the number of symbols provided to a network link of the network 306 by the modulator 310 during a time period. In one aspect, the modulator 310 can be configured to modulate a data symbol as a plurality of data signals at one or more subcarrier frequencies. As an example, the modulator 310 can map one or more bit values of the codeword to a data vector. In one aspect, a data vector can be based on an in-phase value (I-value) and a quadrature value (Q-value). For example, the I-value and Q-value can define two orthogonal components of the data vector. The I-value and Q-value can be mapped or otherwise associated with the one or more bit values according to a predefined constellation diagram. For example, a predefined constellation diagram can specify a mapping (e.g., association, relationships) of I-values and Q-values to corresponding data values, such as one or more bit values. The modulator 310 can generate a data signal based on the I-value and Q-value. The modulator 310 can also generate the data signal based on amplitude values according to the predefined constellation diagram. In some scenarios, the I-value and Q-value can inherently comprise amplitude values. In other scenarios, the amplitude values can be separate from the I-value and Q-value. As an illustration, the modulator 310 can generate a sinusoidal signal with particular amplitudes, I-values, and Q-values at a subcarrier frequency associated with a symbol. As a further example, the I-value can define a sinusoidal wave component that is shifted in phase (e.g., 90 degrees) from a sinusoidal wave component defined by the Q-value.

In one aspect, the system 300 can comprise a second device 312. The second device 312 can be configured to receive data 304 from the first device 302 through the network 306. As an example, the received data 304 can be a first data signal. The second device 312 can be configured to process the data 304 (e.g., first data signal) and provide the data 304 for consumption by one or more users (e.g., subscriber, customer). The second device 312 can comprise a set-top box, television, computing device, digital streaming device, gateway, and/or other device configured to receive a modulated data signal.

In one aspect, the second device 312 can comprise a demodulator 314. In one aspect, the demodulator 314 can be configured to demodulate data 304 that is transmitted across the network 306. The demodulator 314 can be configured to receive modulated signals representative of data bits of the data 304 (e.g., first data signal) and associated error check bits. In one aspect, the demodulator 314 can be configured to determine a value for each data bit according to at least a portion of a data signal received by the demodulator 314 (e.g., first data signal). In an aspect, the demodulator 314 can be configured to determine a probability that the data signal represents a transmitted data value. For example, the demodulator 314 can be configured to determine an amplitude, I-value, Q-value, and/or the like of a received data signal at a subcarrier frequency. The demodulator 314 can be configured to determine a probability that the received data signal (e.g., and/or corresponding amplitude, I-value, and Q-value) represents a transmitted data value. As an explanation, the received data signal can be distorted by noise signals or other interference as the signal travels across the network 306. Accordingly, the data signal received by the second device 312 (e.g., first data signal) can be different than the original signal transmitted from the first device 302 (e.g., a third data signal). For example, the probability that a data signal represents a transmitted data value can be a likelihood ratio. A likelihood ratio can comprise a ratio of a probability that a signal represents a first value (e.g., 1) and a probability that the signal represents a second value (e.g., 0). As a further explanation, a likelihood ratio can comprise a log-likelihood ratio. For example, a log-likelihood ratio can comprise the value of a logarithm function (e.g., natural log) applied to the likelihood ratio.

In one aspect, the second device 312 can comprise a decoder 316. The decoder can comprise a soft-decision decoder configured to determine the values of a plurality of data bits based on probability values associated with data bits. In one aspect, the decoder 316 can comprise a low density parity check decoder. For example, the decoder 316 can be configured to receive at least one probability from the demodulator 314. As an example, the decoder 316 can be configured to determine the value of data bits based on the probability. The decoder 316 can be configured to receive a respective probability corresponding to each (or at least one) data bit value of received data.

In one aspect, the decoder 316 can be configured to determine data bit values of the received data signal (e.g., first data signal) based on at least one probability value (e.g., log likelihood ratio) representative of an error check bit (e.g., parity check bit). For example, the decoder 316 can be configured to perform an iterative error checking process based on the at least one probability value. As a further example, the decoder 316 can use a message passing algorithm to iteratively converge on a determination (e.g., or approximation) of the data bit values of a transmitted codeword.

In one aspect, the second device 312 can comprise a network analysis unit 318. The network analysis unit 318 can comprise a re-modulating unit 322 configured to process output data from the decoder 316. For example, the re-modulating unit 322 can map one or more bit values of the codeword determined at the decoder 316 to one or more data vectors. In one aspect, a data vector can be based on an in-phase value (I-value) and a quadrature value (Q-value). For example, the I-value and Q-value can define two orthogonal components of the data vector. The I-value and Q-value can be mapped or otherwise associated with the one or more bit values according to a predefined constellation diagram. The re-modulating unit 322 can generate a data signal (e.g., real or emulated) based on the I-value and Q-value. The re-modulating unit 322 can also generate the data signal based on amplitude values according to the predefined constellation diagram. In some scenarios, the I-value and Q-value can inherently comprise amplitude values. In other scenarios, the amplitude values can be separate from the I-value and Q-value. As an illustration, the re-modulating unit 322 can generate a plurality of symbols (e.g., a sinusoidal signal) with particular amplitudes, I-values, and Q-values at a subcarrier frequency associated with a symbol based on the codeword determined at the decoder 316. As a further example, the I-value can define a sinusoidal wave component that is shifted in phase (e.g., 90 degrees) from a sinusoidal wave component defined by the Q-value. A calculated received data (e.g., a second data signal) can be determined based on the plurality of symbols. In other words, the output of the re-modulating unit 322 can comprise a plurality of complex numbers representing a plurality of symbols based on a plurality of respective codewords determined at the decoder 316.

In an aspect, the network analysis unit 318 can comprise a modulation error ratio (MER) unit 324 configured to determine a modulation error ratio (MER) based on a difference between the received data signal (e.g., first data signal) and a calculated received data signal output from the re-modulation unit (e.g., second data signal). The MER can be determined based on a vector distance between the received data signal (e.g., first data signal) and the calculated received data signal (e.g., second data signal). As a further illustration, the MER unit 324 can be configured to determine a first portion of the calculated received data signal output that corresponds to a second portion of the received data signal. For example, the first portion can comprise a received data vector. The second portion can comprise a calculated data vector. The calculated data vector can represent a data vector transmitted from the first device 302 that corresponds to the received data vector. For example, the data vector transmitted from the first device 302 can be received by the second device 312 as the received data vector.

In one aspect, the MER unit 324 can be configured to determine that a calculated data vector corresponds (e.g., for the purposes of comparison and MER determination) to a received data vector based on timing information. For example, the second device 312 can be configured to receive timing information from the first device 302. Example timing information can comprise time clock information, frequency clock information, and/or the like. For example, the second device 312 can receive time clock information and frequency clock information from the second device 312. The second device 312 can comprise a time clock and/or frequency clock, which the second device 312 can synchronize with the timing information received from the first device 302. In one aspect, the MER unit 324 can be configured to determine that the calculated data vector corresponds to the received data vector based on a common modulation procedure, such as common procedure for mapping data vectors to symbols and subcarriers. As an example, both the modulator 310 and the re-modulating unit 322 can be configured to map codewords to data vectors based on the same constellation diagram, which specifies I-values and Q-values for various combinations of data bits of a codeword. As another example, the modulator 310 and the re-modulating unit 322 can be configured to map the data vectors to subcarrier frequencies of symbols based on the same modulation procedure. As an illustration, the modulation procedure can specify a protocol, sequence, and/or other information for mapping data vectors to one or more data symbols. The data symbols can comprise a plurality of data vectors mapped to different subcarrier frequencies. In one aspect, the data can be transmitted and received as a sequence of data symbols separated by a predefined time (e.g., 40 microseconds). Accordingly, the MER unit 324 can correlate a received data vector at X subcarrier frequency that is sent as part of Y symbol at time Z with a calculated data vector specified to be mapped to X subcarrier frequency as part of Y symbol at time Z. In one aspect, the X, Y, and Z variables can be determined by the common modulation procedure.

Figure 4:
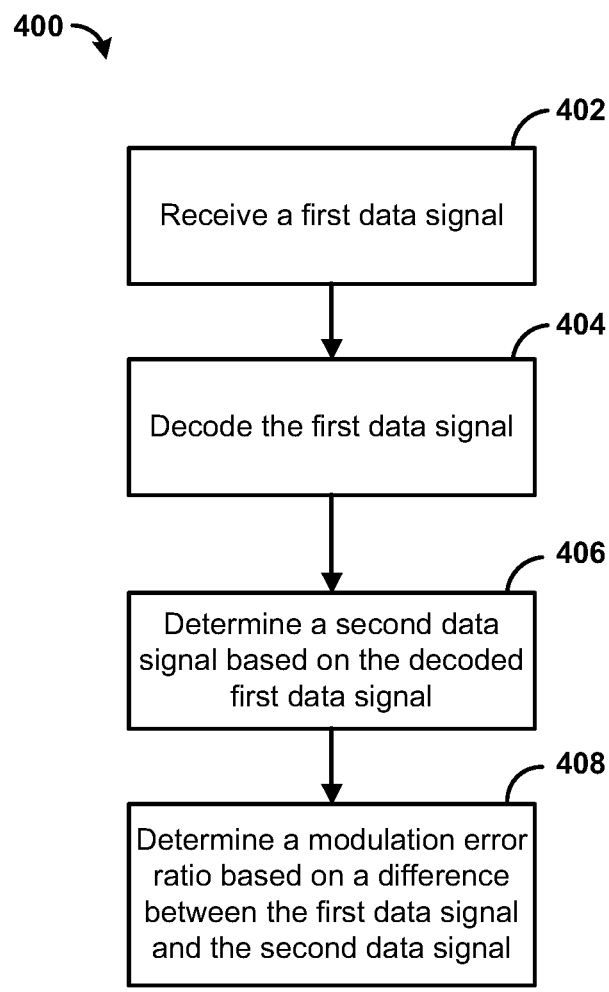
FIG. 4 is a flowchart illustrating an example method.

FIG. 4 is a flowchart illustrating an example method 400 for analyzing data. At step 402, a first data signal can be received. For example, the first data signal can be received at a first device. The first data signal can be received from a second device. In one aspect, the first data signal can be and/or comprise a distorted signal of an original data signal transmitted by the second device. The first data signal can comprise data bits and associated error check bits. In an aspect, the first data signal can be received across a network link (e.g., network 306) at the first device (e.g., second device 312). In an aspect, the data signal received by the first device 312 (e.g., first data signal) can be different than the original signal transmitted from the first device 302. For example, the first data signal can be distorted by noise signals or other interference as the signal travels across a network (e.g., network 306). As a further example, the original data signal can be distorted by noise or otherwise during transmission from the second device to the first device. Accordingly, the first data signal can be a distorted signal of the original data signal transmitted from the second device (e.g., the first device 302). As another example, the data bits of the first data signal are intended to be the same as data bits transmitted from the second device, but distortion that occurs during transmission or otherwise can alter the transmitted data signal such that the first data signal is a distortion of the original signal transmitted from the second device.

In an aspect, the first data signal can be demodulated by a demodulator (e.g., demodulator 314). The demodulator (e.g., the demodulator 314) can be configured to determine a value for each data bit according to at least a portion of the first data signal. For example, the demodulator 314 can be configured to determine an amplitude, I-value, Q-value, and/or the like of the first data signal at a subcarrier frequency. The demodulator 314 can be configured to determine a probability that the first data signal (e.g., and/or corresponding amplitude, I-value, and Q-value) represents a transmitted data value.

At step 404, the first data signal can be decoded. As an example, step 404 can comprise decoding the data with a soft-decision decoder, such as low-density parity-check decoder, configured to decoded data based on probability values representative of error check bits (e.g., parity check bits). In one aspect, the probabilities determined herein can comprise likelihood ratios. A likelihood ratio can comprise a ratio of a probability that a bit value equals a first value (e.g., 1) and a probability that a bit value equals a second value (e.g., 0). As a further explanation, a likelihood ratio can comprise a log-likelihood ratio. For example a logarithm function can be applied to the likelihood ratio. As an illustration, the probability can comprise a likelihood ratio. As another example, step 404 can comprise determining a codeword based on probability values (e.g., at least one log-likelihood ratio). For example, the codeword can be determined based on a message passing algorithm and at least one log-likelihood ratio. In an aspect, step 404 can be achieved in a decoder (e.g., decoder 316) configured to perform an iterative error checking process based on the at least one probability value (e.g., at least one log-likelihood ratio). The decoder (e.g., decoder 316) can use a message passing algorithm to iteratively converge on a determination (e.g., or approximation) of the data bit values of a codeword.

At step 406, a second data signal can be determined based on the decoded first data signal. In one aspect, the second data signal can comprise, represent, be indicative of, and/or the like an estimation of the original data signal transmitted by the second device. Step 406 can comprise determining the second data signal based on at least a portion of a modulation process (e.g., via re-modulating unit 322) applied to at least a portion of the decoded first data signal. For example, the re-modulating unit 322 can process output data (e.g., codeword) from the decoder 316. For example, the re-modulating unit 322 can map one or more bit values of the codeword determined at step 404 to a data vector. In one aspect, a data vector can be based on an in-phase value (I-value) and a quadrature value (Q-value). For example, the I-value and Q-value can define two orthogonal components of the data vector. The I-value and Q-value can be mapped or otherwise associated with the one or more bit values according to a predefined constellation diagram. The re-modulating unit 322 can generate the second data signal based on the I-value and Q-value. The re-modulating unit 322 can also generate the second data signal based on amplitude values according to the predefined constellation diagram. In some scenarios, the I-value and Q-value can inherently comprise amplitude values. In other scenarios, the amplitude values can be separate from the I-value and Q-value. As an illustration, the re-modulating unit 322 can generate a plurality of symbols (e.g., a sinusoidal signal) comprising one or more data vectors at particular amplitudes, I-values, and Q-values at a subcarrier frequency associated with a symbol based on the codeword determined at step 404. As a further example, the I-value can define a sinusoidal wave component that is shifted in phase (e.g., 90 degrees) from a sinusoidal wave component defined by the Q-value.

At step 408, a modulation error ratio can be determined based on a difference between the first data signal and the second data signal. For example, step 408 can comprise determining a vector distance between the first data signal and the second data signal at MER analysis unit 324 of the second device 312. For example, step 408 can be achieved by measuring a distance between a data vector (e.g., phase and magnitude) associated with the first data signal and a calculated data vector (e.g., calculated phase and magnitude) associated with the second data signal. For example, the MER unit 324 can be configured to determine that the calculated data vector (e.g., or the second data signal) corresponds (e.g., for the purposes of comparison and MER determination) to a received data vector (e.g., or the first data signal) based on timing information (e.g., time clock information, frequency clock information), a common modulation procedure (e.g., a protocol, sequence, common procedure for mapping data vectors to symbols and subcarriers), and/or combination thereof.

Figure 5:
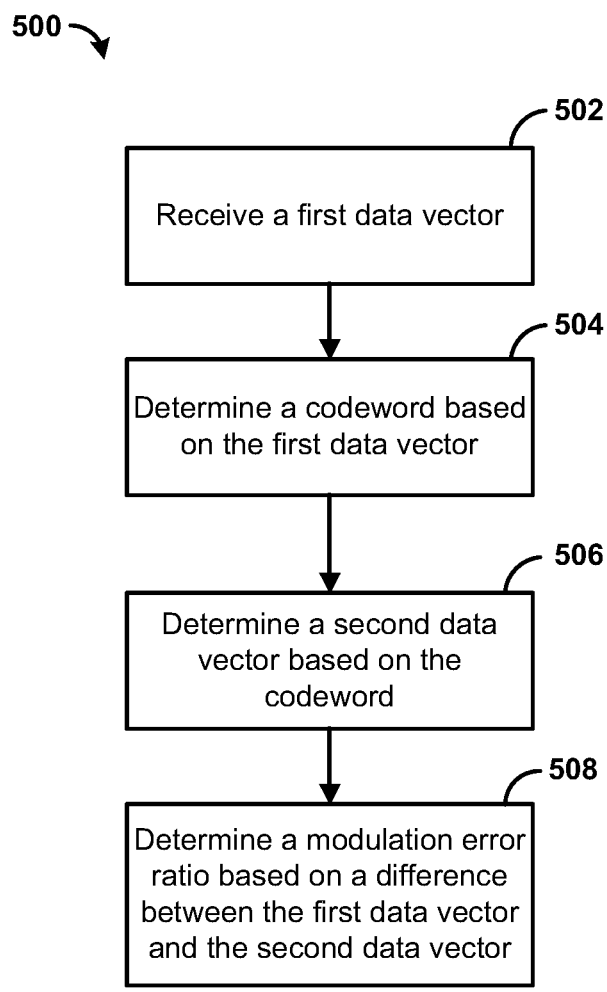
FIG. 5 is a flowchart illustrating another example method.

FIG. 5 is a flowchart illustrating another example method 500 for analyzing data. At step 502, a first data vector can be received. The first data vector can comprise data bits and associated error check bits (e.g., parity check bits). In an aspect, the first data vector can be received across a network link (e.g., network 306) at a second device. In an aspect, the data vector (e.g., first data vector) received by a second device (e.g., second device 312) can be different than an original data vector (e.g., third data vector) transmitted from a first device (e.g., first device 302). For example, the first data vector can be distorted by noise signals or other interference as the data (e.g., data 304) travels across a network (e.g., network 306). Accordingly, the first data vector can be a distorted signal of the original data vector (e.g., third data vector). As another example, the data bits of the first data vector are intended to be the same as data bits transmitted from the second device, but distortion that occurs during transmission or otherwise can alter the original data vector such that the first data vector is a distortion of the original data vector transmitted from the second device.

In an aspect, the first data vector can be demodulated by a demodulator (e.g., demodulator 314). The demodulator (e.g., the demodulator 314) can be configured to determine a value for each data bit according to at least a portion of the first data vector. For example, the demodulator 314 can be configured to determine an amplitude, I-value, Q-value, and/or the like of the first data vector at a subcarrier frequency. The demodulator 314 can be configured to determine a probability that the first data vector (e.g., and/or corresponding amplitude, I-value, and Q-value) represents a transmitted data value.

At step 504, a codeword can be determined based on the first data vector. In an aspect, the codeword can be determined based on probability values (e.g., at least one log-likelihood ratio). In one aspect, the probabilities determined herein can comprise likelihood ratios. A likelihood ratio can comprise a ratio of a probability that a bit value equals a first value (e.g., 1) and a probability that a bit value equals a second value (e.g., 0). As a further explanation, a likelihood ratio can comprise a log-likelihood ratio. For example, a logarithm function can be applied to the likelihood ratio. As an illustration, the probability can comprise a likelihood ratio. For example, the codeword can be determined based on a message passing algorithm and at least one log-likelihood ratio. In an aspect, step 504 can be achieved in a soft-decision decoder (e.g., decoder 316) on the second device 312, such as low-density parity-check decoder, configured to perform an iterative error checking process based on the at least one probability value (e.g., at least one log-likelihood ratio), based on probability values representative of error check bits (e.g., parity check bits). The soft decision decoder (e.g., low-density parity-check decoder) can use a message passing algorithm to iteratively converge on a determination (e.g., or approximation) of the data bit values of a codeword.

At step 506, a second data vector can be determined based on the codeword. In an aspect, step 506 can comprise determining the second data signal based on at least a portion of a modulation process (e.g., via re-modulating unit 322) applied to at least a portion of the decoded first data vector. For example, the re-modulating unit 322 can process the codeword determined at step 504. For example, the re-modulating unit 322 can map one or more bit values of the codeword determined at step 504 to a data vector. For example, an in phase value (I-value) and a quadrature value (Q-value) can define two orthogonal components of the data vector. The I-value and Q-value can be mapped or otherwise associated with the one or more bit values according to a predefined constellation diagram. The re-modulating unit 322 can generate a second data vector based on the I-value and Q-value. The re-modulating unit 322 can also generate the second data signal based on amplitude values according to the predefined constellation diagram. In some scenarios, the I-value and Q-value can inherently comprise amplitude values. In other scenarios, the amplitude values can be separated from the I-value and Q-value. As an illustration, the re-modulating 322 can generate a plurality of symbols (e.g., a sinusoidal signal) with particular amplitudes, I-values, and Q-values at a subcarrier frequency associated with a symbol based on the codeword determined at step 504. As a further example, the I-value can define a sinusoidal wave component that is shifted in phase (e.g., 90 degrees) from a sinusoidal wave component defined by the Q-value.

At step 508, a modulation error ratio can be determined based on a difference between the first data vector and the second data vector. For example, step 508 can comprise determining a vector distance between the first data vector and the second data vector at MER analysis unit 324 of the second device 312. For example, step 508 can be achieved by measuring a distance between the first data vector and a calculated data vector (e.g., calculated phase and magnitude), such as the second data vector. For example, the MER unit 324 can be configured to determine that the first data vector corresponds (e.g., for the purposes of comparison and MER determination) to the second data vector based on timing information (e.g., time clock information, frequency clock information), a common modulation procedure (e.g., a protocol, sequence, common procedure for mapping data vectors to symbols and subcarriers), and/or combination thereof.

Figure 6:
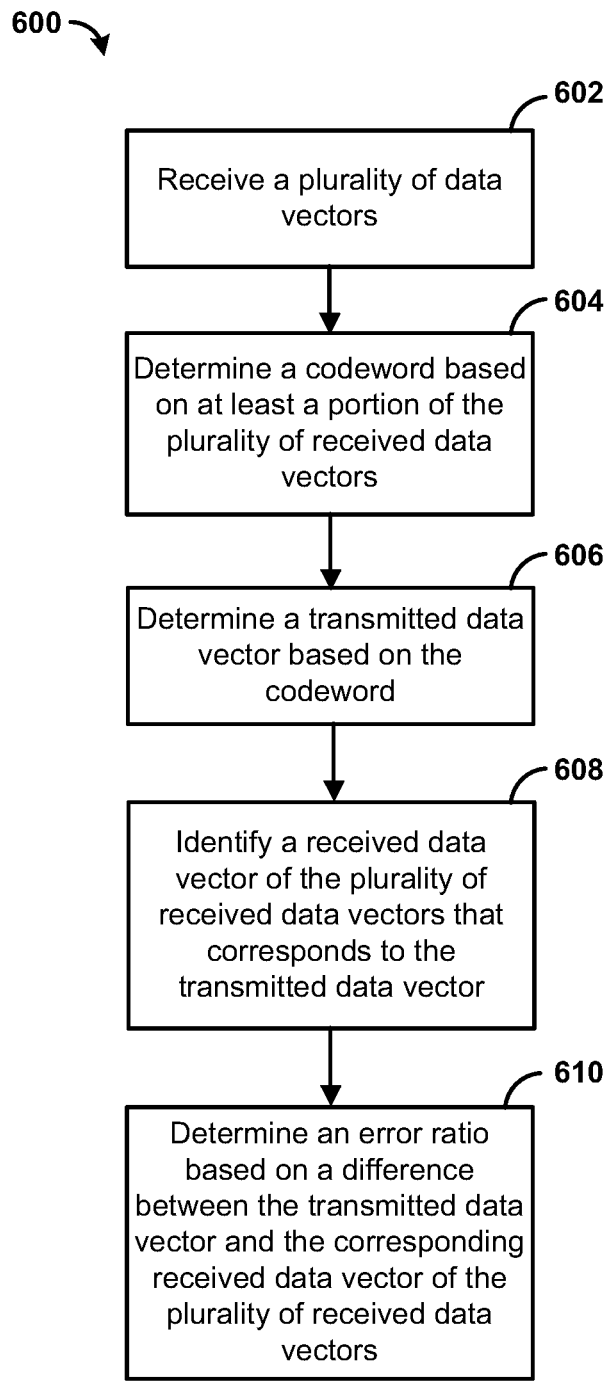
FIG. 6 is a flowchart illustrating yet another example method.

FIG. 6 is a flowchart illustrating yet another example method 600 for analyzing data. At step 602, a plurality of data vectors can be received. In an aspect, a data signal can comprise a plurality of data vectors. A data vector can comprise respective data bits and associated error check bits (e.g., parity check bits). In an aspect, the plurality of data vectors can be received across a network link (e.g., network 306) at a second device (e.g., second device 312). In an aspect, the plurality of data vectors received by the second device 312 can be different than a plurality of original data vectors (e.g., third data vectors) transmitted from a first device (e.g., first device 302). For example, the plurality of data vectors received at the second device 312 can be distorted by noise signals or other interference as the original plurality of data vectors travel across a network (e.g., network 306). As another example, the data bits of the received plurality of data vectors are intended to be the same as data bits transmitted from the first device, but distortion that occurs during transmission or otherwise can alter the original data vectors transmitted from the first device such that one or more of the received plurality of data vectors are a distortion of the original data vectors transmitted from the first device.

In an aspect, the plurality of data vectors can be demodulated by a demodulator (e.g., demodulator 314). The demodulator (e.g., the demodulator 314) can be configured to determine a value for each data bit according to at least a portion of the plurality of data vectors. For example, the demodulator 314 can be configured to determine amplitudes, I-values, Q-values, and/or the like of the plurality of data vectors at their respective subcarrier frequency. The demodulator 314 can be configured to determine probabilities that the plurality of data vectors (e.g., and/or corresponding amplitude, I-value, and Q-value) represent a transmitted data value.

At step 604, a codeword can be determined based on at least a portion of the plurality of received data vectors. In an aspect, the codeword can be determined based on probability values (e.g., log-likelihood ratios). In one aspect, the probabilities determined herein can comprise likelihood ratios. A likelihood ratio can comprise a ratio of a probability that a bit value equals a first bit value (e.g., 1) and a probability that a bit value equals a second bit value (e.g., 0). As a further explanation, a likelihood ratio can comprise a log-likelihood ratio. For example a logarithm function can be applied to the likelihood ratio. As an illustration, the probability can comprise a likelihood ratio. For example, the codeword can be determined based on a message passing algorithm and at least one log-likelihood ratio. In an aspect, step 604 can be achieved in a soft-decision decoder (e.g., decoder 316), such as low-density parity-check decoder, configured to perform an iterative error checking process based on the at least one probability value (e.g., at least one log-likelihood ratio), based on probability values representative of error check bits (e.g., parity check bits). The soft decision decoder (e.g., low-density parity-check decoder) can use a message passing algorithm to iteratively converge on a determination (e.g., or approximation) of the data bit values of a codeword. A received data vector of a plurality of data vectors can correspond to a respective codeword. One or more codewords can correspond to a plurality of data vectors received at step 602.

At step 606, a transmitted data vector can be determined based on the codeword. In an aspect, step 606 can comprise determining the transmitted data vector based on at least a portion of a modulation process (e.g., via re-modulating unit 322) applied to at least a portion of the plurality of received data vectors. For example, the re-modulating unit 322 can process the codeword determined at step 604 by mapping one or more bit values of the codeword to a plurality of data vectors. In one aspect, the plurality of data vectors can be based on an in-phase value (I-value) and a quadrature value (Q-value). For example, the I-value and Q-value can define two orthogonal components of a data vector. The I-value and Q-value can be mapped or otherwise associated with the one or more bit values of the codeword according to a predefined constellation diagram. The re-modulating unit 322 can generate a transmitted data vector based on the I-values and Q-values. The re-modulating unit 322 can also generate the transmitted data vectors based on amplitude values according to the predefined constellation diagram. In some scenarios, the I-values and Q-values can inherently comprise amplitude values. In other scenarios, the amplitude values can be separate from the I-value and Q-value. As an example, the re-modulating unit 322 can generate plurality of symbols (e.g., a sinusoidal signal) with particular amplitudes, I-values, and Q-values at a subcarrier frequency associated with a symbol based on the codeword determined at step 604. As a further example, the I-value can define a sinusoidal wave component that is shifted in phase (e.g., 90 degrees) from a sinusoidal wave component defined by the Q-value.

At step 608, a received data vector of the plurality of received data vectors that corresponds to the transmitted data vector can be identified. In an aspect, step 608 can comprise associating a symbol related to the received data vector of the plurality of received data vectors with a calculated symbol related to the transmitted data vector. In one aspect, the MER unit 324 can determine that the transmitted data vector corresponds (e.g., for the purposes of comparison and MER determination) to the received data vector of the plurality of received data vectors based on timing information. For example, the second device 312 can be configured to receive timing information from the first device 302. Example timing information can comprise time clock information, frequency clock information, and/or the like. For example, the second device 312 can receive time clock information and frequency clock information from the second device 312. The second device 312 can comprise a time clock and/or frequency clock, which the second device 312 can synchronize with the timing information received from the first device 302. In one aspect, the MER unit 324 can be configured to determine that the calculated data vector corresponds to the received data vector based on a common modulation procedure, such as common procedure for mapping data vectors to symbols and subcarriers. As an example, both the modulator 310 and the re-modulating unit 322 can be configured to map codewords to data vectors based on the same constellation diagram, which specifies I-values and Q-values for various combinations of data bits of a codeword. As another example, the modulator 310 and the re-modulating unit 322 can be configured to map the data vectors to subcarrier frequencies of symbols based on the same modulation procedure. As an illustration, the modulation procedure can specify a protocol, sequence, and/or other information for mapping data vectors to one or more data symbols. The data symbols can comprise a plurality of data vectors mapped to different subcarrier frequencies. In one aspect, the data can be transmitted and received as a sequence of data symbols separated by a predefined time (e.g., 40 microseconds). Accordingly, the MER unit 324 can correlate a received data vector at X subcarrier frequency that is sent as part of Y symbol at time Z with the transmitted data vector specified to be mapped to X subcarrier frequency as part of Y symbol at time Z. In one aspect, the X, Y, and Z variables can be determined by the common modulation procedure.

At step 610, an error ratio can be determined based on a difference between the transmitted data vector and the corresponding received data vector of the plurality of received data vectors. In an aspect, step 610 can comprise determining a vector distance between the transmitted data vector and the corresponding received data vector of the plurality of received data vectors. For example, step 610 can be achieved by measuring a distance between the received data vector (e.g., phase and magnitude) and the transmitted data vector (e.g., calculated phase and magnitude) of each symbol associated with the transmitted data vector. For example, the MER unit 324 can be configured to determine that the transmitted data vector corresponds (e.g., for the purposes of comparison and MER determination) to a received data vector based on timing information (e.g., time clock information, frequency clock information), a common modulation procedure (e.g., a protocol, sequence, common procedure for mapping data vectors to symbols and subcarriers), and/or combination thereof.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification. It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

The invention claimed is:

1. A method, comprising:
   receiving, by a first computing device from a second computing device, a first data signal comprising first timing information;
   determining, by the first computing device based on a mapping of a codeword to a symbol and to second timing information corresponding to a generated portion of the codeword, a second data signal representative of an original data signal sent by the second computing device; and
   determining, by the first computing device based on a difference between the first timing information and the second timing information, a modulation error ratio.

2. The method of claim 1, wherein the first timing information comprises one or more of: time clock information associated with the first data signal or frequency clock information associated with the first data signal, and
   wherein the second timing information comprises one or more of: time clock information associated with the second data signal or frequency clock information associated with the second data signal.

3. The method of claim 1, further comprising synchronizing the first timing information with the second timing information.

4. The method of claim 1, wherein determining the modulation error ratio is based on a difference between the first data signal and the second data signal.

5. The method of claim 1, wherein the first data signal represents distortion or interference of the original data signal sent by the second computing device.

6. The method of claim 1, further comprising determining the codeword by decoding, via a low density parity check decoder, a portion of the first data signal, wherein the first data signal comprises a plurality of codewords.

7. The method of claim 1, further comprising determining the codeword via a message passing algorithm.

8. The method of claim 1, further comprising determining a plurality of symbols corresponding to the generated portion of the codeword.

9. The method of claim 8, wherein the plurality of symbols comprise the symbol and wherein the plurality of symbols comprise sinusoidal signals.

10. The method of claim 1, wherein the second data signal represents an estimation of the original data signal sent by the second computing device.

11. An apparatus, comprising:
    one or more processors; and
    a memory storing processor-executable instructions that, when executed by the one or more processors, cause the apparatus to:

receive, by a first computing device from a second computing device, a first data signal comprising first timing information;

determine, by the first computing device based on a mapping of a codeword to a symbol and to second timing information corresponding to a generated portion of the codeword, a second data signal representative of an original data signal sent by the second computing device; and determine, by the first computing device based on a difference between the first timing information and the second timing information, a modulation error ratio.

12. The apparatus of claim 11, wherein the first timing information comprises one or more of:

time clock information associated with the first data signal or frequency clock information associated with the first data signal, and wherein the second timing information comprises one or more of: time clock information associated with the second data signal or frequency clock information associated with the second data signal.

13. The apparatus of claim 11, wherein the processor-executable instructions further cause the apparatus to synchronize the first timing information with the second timing information.

14. The apparatus of claim 11, wherein the processor-executable instructions further cause the apparatus to determine that the modulation error ratio is based on a difference between the first data signal and the second data signal.

15. The apparatus of claim 11, wherein the first data signal represents distortion or interference of the original data signal sent by the second computing device.

16. The apparatus of claim 11, wherein the processor-executable instructions further cause the apparatus to determine the codeword by decoding, via a low density parity check decoder, a portion of the first data signal, wherein the first data signal comprises a plurality of codewords.

17. The apparatus of claim 11, wherein the processor-executable instructions further cause the apparatus to determine the codeword via a message passing algorithm.

18. The apparatus of claim 11, wherein the processor-executable instructions further cause the apparatus to determine a plurality of symbols corresponding to the generated portion of the codeword.

19. The apparatus of claim 18, wherein the plurality of symbols comprise the symbol and wherein the plurality of symbols comprise sinusoidal signals.

20. The apparatus of claim 11, wherein the second data signal represents an estimation of the original data signal sent by the second computing device.

* * * * *